(12) United States Patent
Altemose

(10) Patent No.: US 7,786,701 B2
(45) Date of Patent: Aug. 31, 2010

(54) COMPENSATION FOR PARASITIC RESISTANCE IN BATTERY MONITORING

(75) Inventor: George Altemose, Stony Brook, NY (US)

(73) Assignee: Aeroflex Plainview, Inc., Plainview, NY (US)

( * ) Notice: Subject to any disclaimer, the term of this patent is extended or adjusted under 35 U.S.C. 154(b) by 713 days.

(21) Appl. No.: 11/773,567

(22) Filed: Jul. 5, 2007

(65) Prior Publication Data

US 2008/0018305 A1    Jan. 24, 2008

Related U.S. Application Data

(63) Continuation-in-part of application No. 11/443,151, filed on May 31, 2006, now Pat. No. 7,592,775.

(51) Int. Cl.
*H02J 7/00* (2006.01)

(52) U.S. Cl. .................................. 320/136; 320/103

(58) Field of Classification Search ................ 320/118, 320/128, 134, 136, 103; 324/427
See application file for complete search history.

(56) References Cited

U.S. PATENT DOCUMENTS

| 6,140,800 | A | * | 10/2000 | Peterson ................. 320/118 |
|---|---|---|---|---|
| 6,873,134 | B2 | | 3/2005 | Canter et al. |
| 7,193,392 | B2 | | 3/2007 | King et al. |
| 7,245,108 | B2 | | 7/2007 | Chertok et al. |
| 2004/0135545 | A1 | | 7/2004 | Fowler et al. |

OTHER PUBLICATIONS

PCT International Search Report for International Application No. PCT/US07/69667, filing date May 27, 2007, Aeroflex Plainview Inc.

* cited by examiner

*Primary Examiner*—Edward Tso
*Assistant Examiner*—Aaron Piggush
(74) *Attorney, Agent, or Firm*—Locke Lord Bissell & Liddell

(57) ABSTRACT

A system for balancing charge between a plurality of storage battery cells within a storage battery. The battery balancing system may sense changes, possibly caused by environmental influences, in the overall resonant frequency of charge balancing circuits contained within the battery balancing system and compensate for the change in resonant frequency. Further, the system may correct battery cell voltages monitored by a controller that may include errors due to intrinsic circuit problems, such as parasitic voltage, to reflect an actual voltage of a battery cell.

24 Claims, 13 Drawing Sheets

FIG. 1
PRIOR ART
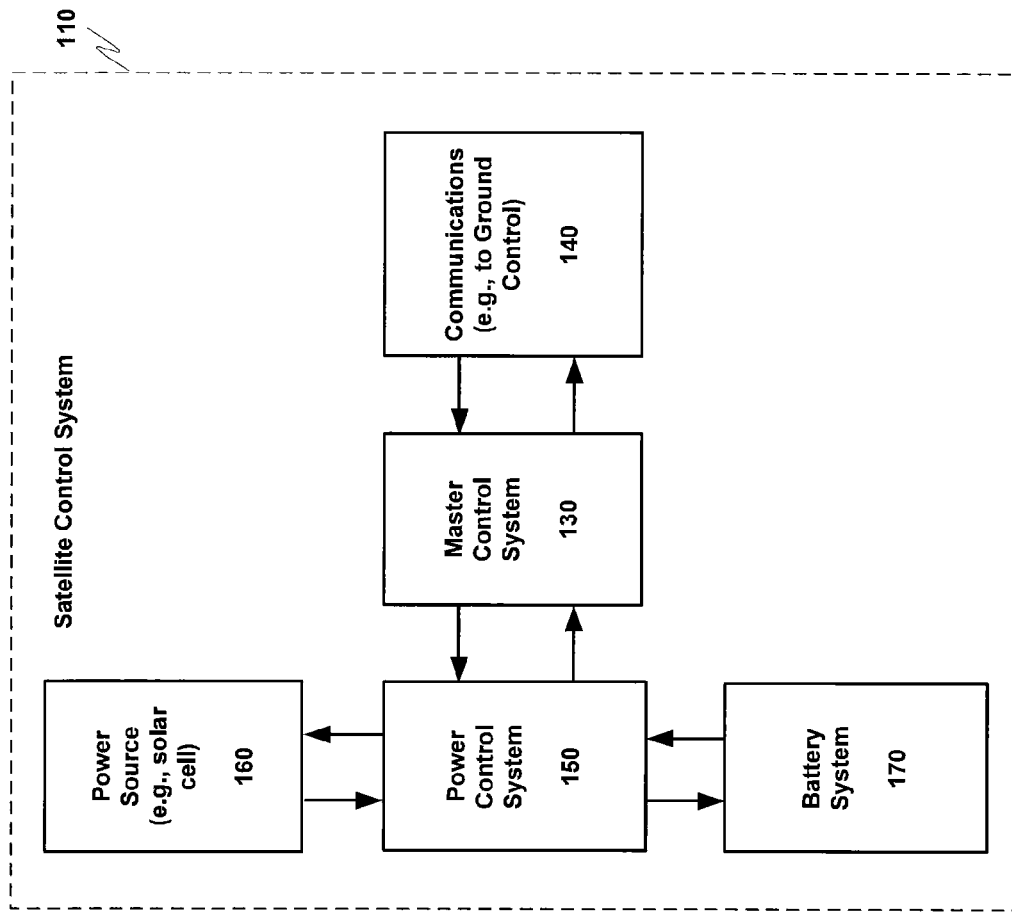
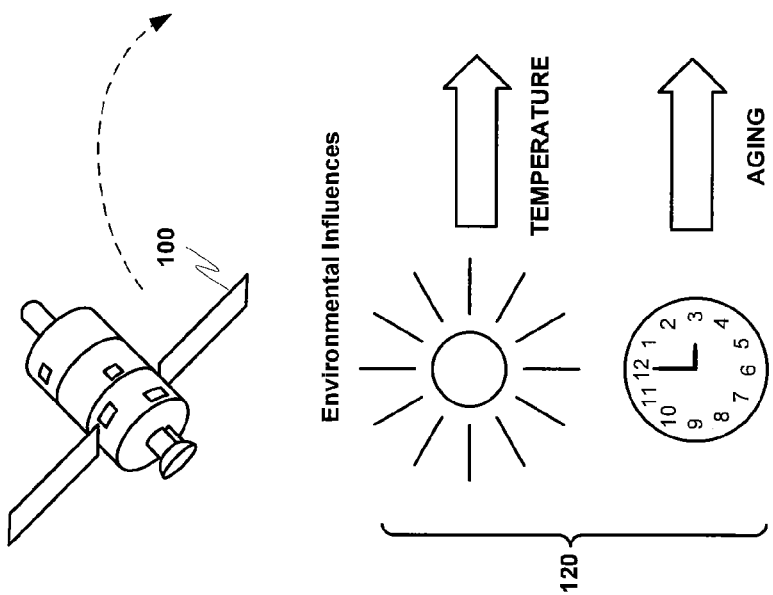

FIG. 2
PRIOR ART
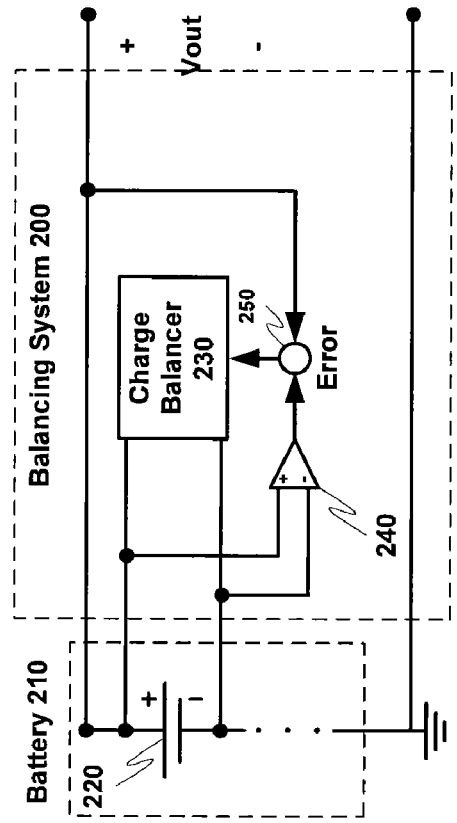
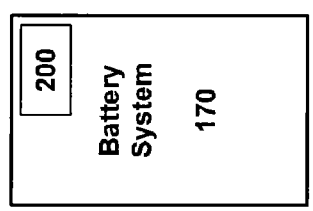
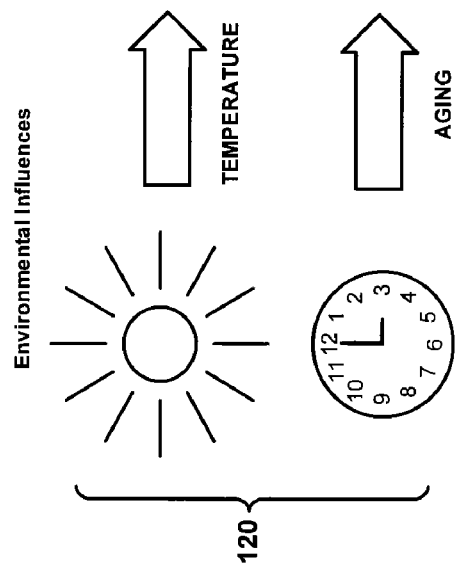

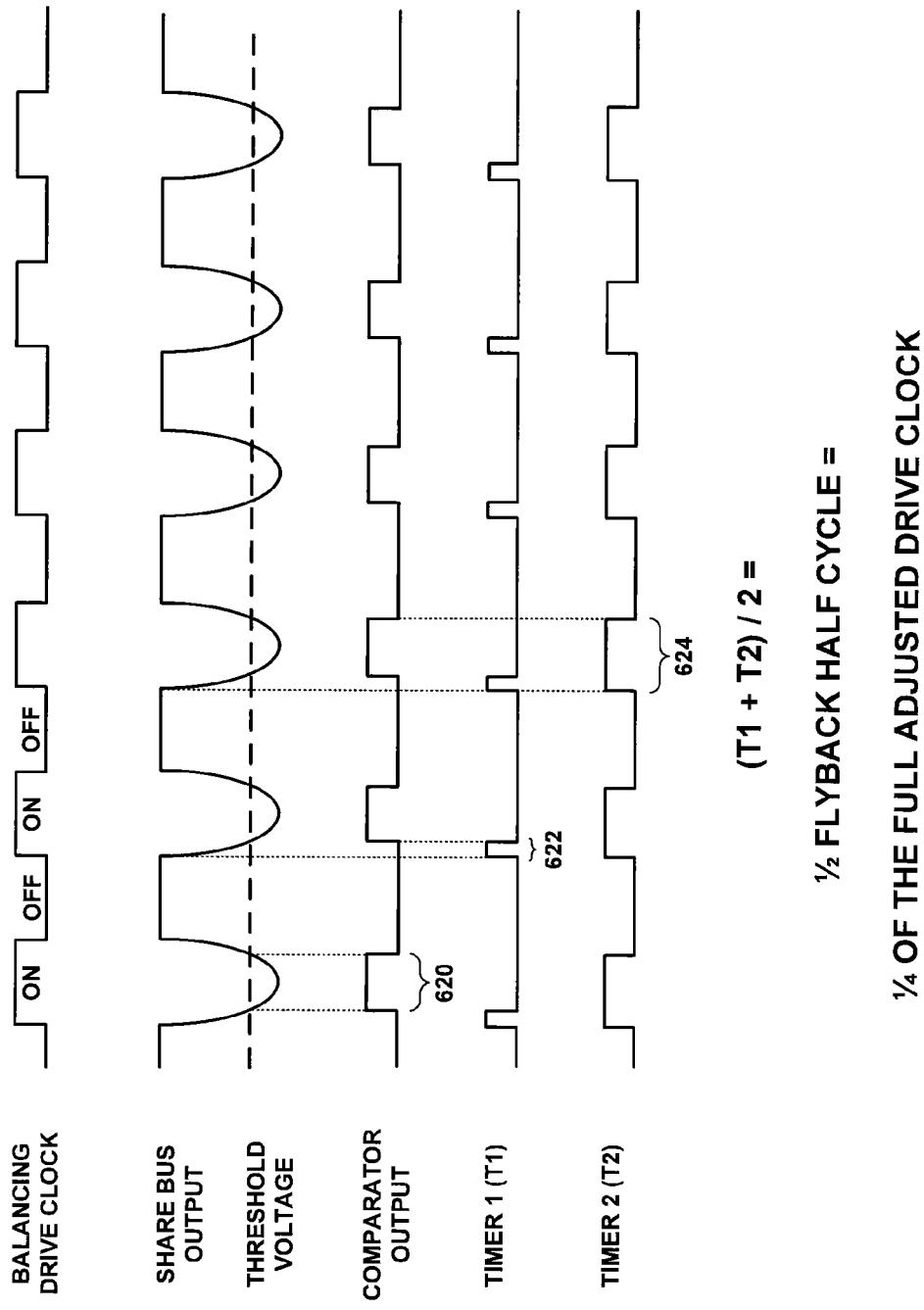

FIG. 7

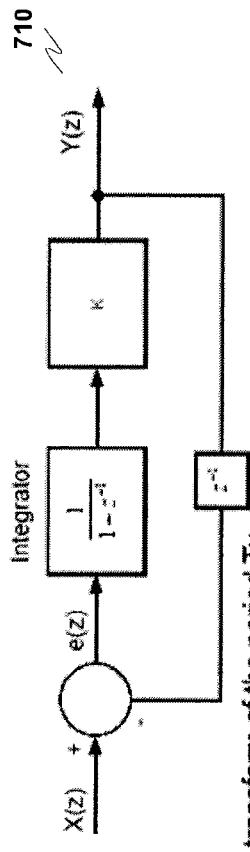
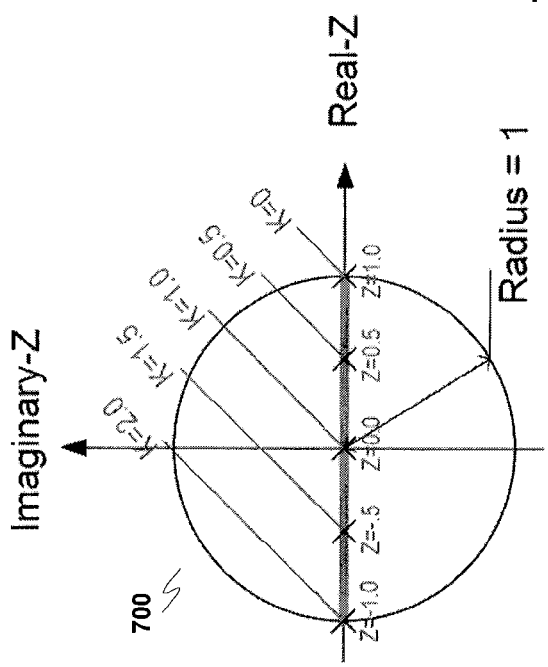

X(z) - Z transform of the period Tx
Y(z) - Z transform of the period Ty
The difference equation of the integrator is
$$y_n = y_{n-1} + e_n$$

The Closed Loop Transfer Function of the system is:
$$G(z) = \frac{Y(z)}{X(z)} = \frac{K}{1-(1-K)\cdot z^{-1}}$$

Stability is guaranteed when poles of the closed loop are inside unit circle,
$$0 < K < 2$$

Or in difference equation format:
$$y_n = y_{n-1} + \frac{x_n - y_{n-1}}{2^M}$$

Where: $K = 2^{-M}$

And the Systems Time constant T is
$$T = 2^M \cdot \tau$$
For M=14 we get T = 163ms Table 1: Selection of K

| N | K |
|---|---|
| 1 | 6.321206E-01 |
| 10 | 9.516258E-02 |
| 100 | 9.950166E-03 |
| 1000 | 9.995002E-04 |
| 10,000 | 9.999500E-05 |
| 100,000 | 9.999950E-06 |
| 1,000,000 | 9.999995E-07 |

Table 2: Selection of K

| Time Constant (ms) | N | K |
|---|---|---|
| 10 | 1,000 | 9.995002E-04 |
| 100 | 10,000 | 9.999500E-05 |
| 500 | 50,000 | 1.999980E-05 |
| 1000 | 100,000 | 9.999950E-06 |

Figure 4: simulation of equation (13)

Table 3: PLL time constant as a function of M

| M | Time Constant (ms) |
|---|---|
| 6 | 0.63 |
| 7 | 1.27 |
| 8 | 2.55 |
| 9 | 5.11 |
| 10 | 10.23 |
| 11 | 20.47 |
| 12 | 40.95 |
| 13 | 81.91 |
| 14 | 163.83 |
| 15 | 327.67 |
| 16 | 655.35 |

# COMPENSATION FOR PARASITIC RESISTANCE IN BATTERY MONITORING

RELATED APPLICATIONS

This application is a continuation-in-part of U.S. application Ser. No. 11/443,151, filed May 31, 2006, entitled "BATTERY BALANCING INCLUDING RESONANT FREQUENCY COMPENSATION," by the same inventive entity of the instant non-provisional application, all of which is herein incorporated by reference.

BACKGROUND OF THE INVENTION

The present invention relates to a device and method for balancing charge between a plurality of storage batteries, and more specifically, to a battery balancing system that compensates for changes in the resonant frequency of charge balancing circuits in order to maintain optimal system performance and to deliver accurate measured characteristics.

DESCRIPTION OF PRIOR ART

Electronic monitoring and control applications require continuously supplied power from one or more reliable sources. These sources may generate power (e.g., solar cells, fossil fuel engines, hydroelectric, etc.) or may provide stored power when generated power is not available. If power is supplied from a combination of sources, the flow of energy supplied from these sources must be managed seamlessly. Power spikes or losses often risk an unrecoverable loss of system control, resulting in damage to equipment or possibly life-threatening situations.

Storage batteries are often used as back-up power when generated power is not available. The individual cells of some types of batteries, for example Lithium Ion batteries, may become unbalanced over continuous use. While these batteries may continue to function, the cell unbalancing may cause performance problems and lessen the overall lifespan of the battery. As a result, battery balancing systems are often employed to equalize the energy stored in the battery cells so that performance may be maximized.

Problems may occur, however, as state of the art battery balancing systems age. Analog components employed in the circuits that monitor and redistribute energy amongst the individual battery cells may experience changes in their overall response time due to age, temperature fluctuations, electromagnetic damage, etc. These circuits are usually designed driven at a constant drive frequency that corresponds to the resonant frequency of the circuit as manufactured. As a result, the "evolving" resonant frequency of the circuit no longer matches the original frequency as the circuit is used, and the overall performance of the circuit declines. The system may further experience disturbances due to non-ideal component behavior intrinsic to the circuit itself. These disturbances may include parasitic resistance that adversely affects the accuracy of cell voltages monitored by a microprocessor coupled to the balancing system, which may in turn impact overall system performance. More specifically, inaccurate measured voltages may result in incorrect control execution, false alarms and possibly even damage to the system.

What is therefore needed is a battery balancing system that is able to account for resonant frequency changes in circuit components by automatically altering the drive frequency to match the current resonant frequency of the system. Further, the system should also be able to compensate for problematic system and/or circuit behavior that may lead to errors in monitored system variables by allowing a controller to adjust an errant measured value to an actual value.

SUMMARY OF INVENTION

The present invention includes a device, method and system for balancing the energy level of a plurality of coupled battery cells, and for determining an actual system characteristic from a monitored system characteristic by adjusting for error-causing factors.

In a first example of the present invention, a controller utilizing a phase-locked loop (PLL) is coupled to a battery balancing system in order to continually optimize battery balancing performance. The battery balancing system may be composed of a plurality of battery balancing circuits, wherein an individual balancing circuit may be coupled to each battery to be balanced. Each battery may further be composed of a plurality of a battery cells.

The battery balancing circuits may conduct current to and from the batteries in order to achieve a balanced energy level between the batteries. The battery balancing circuits, which may be composed at least in part of a forward converter with a resonant fly-back reset circuit, are driven by a battery balancing drive clock. The clock frequency drives the various components of the balancing circuit in a stepwise fashion to allow the charging and discharging of the various components in order to provide the balancing effect.

The aforementioned battery balancing circuits may all be coupled to a common bus, or "share bus," that allows the PLL-based controller to receive a combined resonant signal from the battery balancing circuits. The controller may then measure the combined fly-back time of the balancing circuits in order to determine an appropriate operating frequency for the battery balancing drive clock, which is supplied back to each battery balancing circuit. In this manner, the balancing circuits may be driven at a frequency that matches their current resonant frequency, helping to assure optimum performance in the balancing of stored battery energy.

Further, the system may account for "real world" characteristics not encountered in ideal circuit design. These "real world" factors may include parasitic resistances created by various electronic components in the battery balancing system. While this resistance may not substantially impact the battery balancing functionality, voltages monitored by a microprocessor coupled to the battery balancing system may be altered to a degree where false readings become problematic to functionality performed by the microprocessor such as system control, calibration, optimization and telemetry reporting. The present invention, in at least one embodiment, may use either measured or calculated share bus voltage to adjust measured voltages to account for system disturbances such as parasitic resistance, allowing actual cell voltages to be determined.

DESCRIPTION OF DRAWINGS

The invention will be further understood from the following detailed description of a preferred embodiment, taken in conjunction with appended drawings, in which:

FIG. 1 discloses prior art including an exemplary application wherein at least one embodiment of the present invention may be applied.

FIG. 2 discloses prior art including an example of the effect of environmental influences on exemplary known balancing circuits.

FIG. 6B discloses an alternative implementation of the adjusted drive clock derivation including various waveforms created during operation in accordance with at least one embodiment of the present invention.

FIG. 7 discloses an exemplary mathematical depiction of a transfer function describing the functionality of at least one embodiment of the present invention.

DESCRIPTION OF PREFERRED EMBODIMENT

Figure 3A:
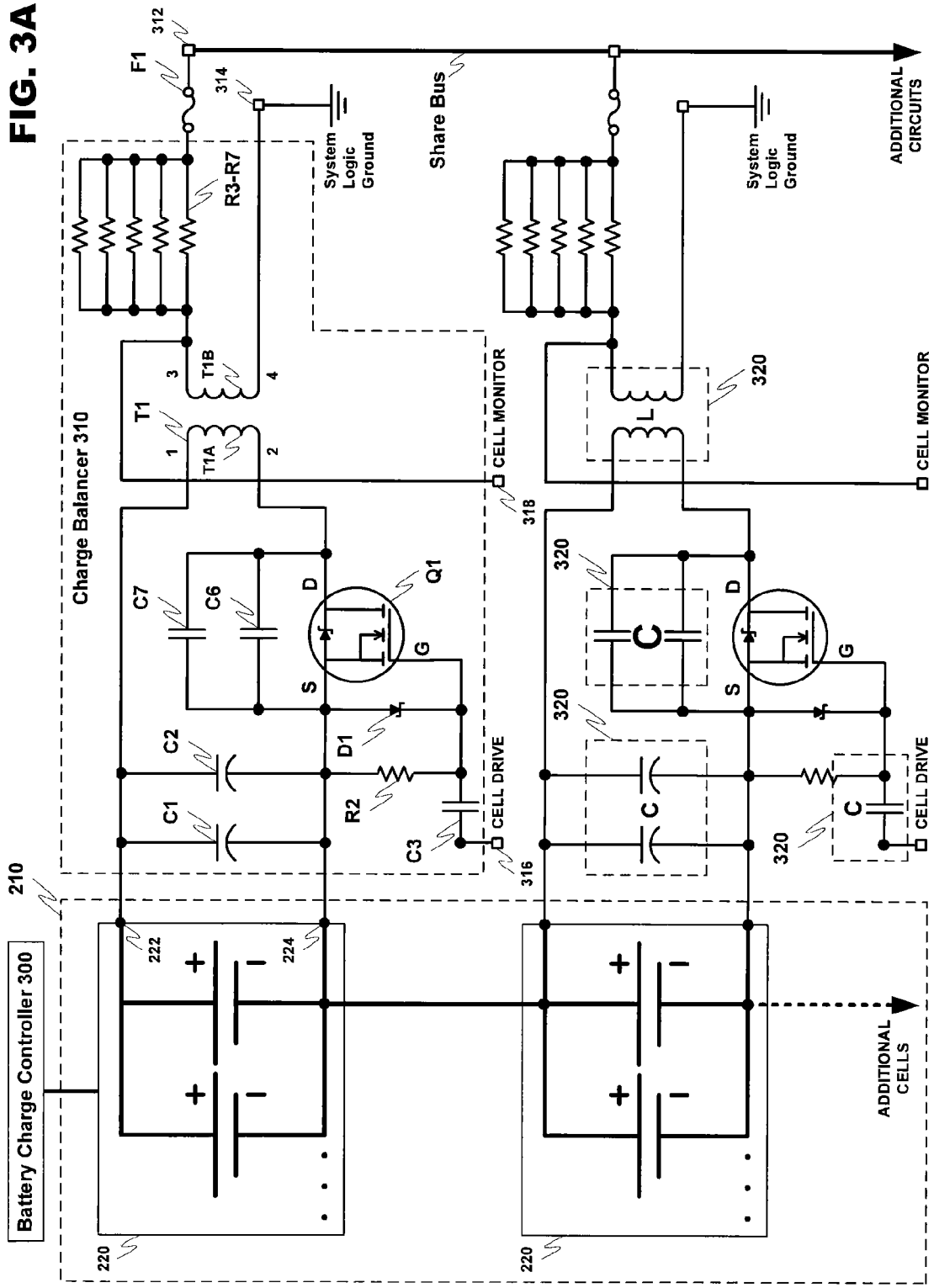
FIG. 3A discloses a battery balancing system usable with at least one embodiment of the present invention.

While the invention has been described in preferred embodiments, various changes can be made therein without departing from the spirit and scope of the invention, as described in the appended claims.

I. Exemplary Application Including a Charge Regulation System.

An exemplary application of power management involving a combination of sources is shown in FIG. 1. Satellite 100 may rely almost exclusively on power generated by solar cells 160 in order to power at least master control system 130 and communications system 140. These systems control all aspects of the satellite, and therefore, need to be continuously powered. However, instances may occur when the solar cells 160 of the satellite are obstructed, for example, due to an eclipse effect caused by the satellite's position in Earth's orbit. In these cases, battery system 170 may be relied upon to maintain power to the satellites systems in order to control positioning, communications or any other important processes within satellite 100.

As further disclosed in FIG. 1, environmental influences 120 may alter the operation of a control system such as described above. More specifically, time (e.g., the aging of analog electronic components within the control system), temperature fluctuations, electromagnetic damage (not pictured), etc. may alter the response time of a control system. Environmental influences 120 may be especially pronounced in satellite control applications, wherein an electronic control system must operate over long periods of time without any repairs, while under extreme temperature conditions.

FIG. 2 discloses a more specific example of the effect of influences like aging and extreme temperature on power control circuitry. Battery system 170 may include a subsystem for balancing the charge among batteries in a multi-cell battery system. Battery balancing system 200 is especially important when large multi-cell banks of rechargeable batteries, for example Lithium Ion batteries, are employed to supply power when generation sources 160 are unavailable. Over time, the relative energy levels between individual cells of a multi-cell battery may become unequal. While the batteries may continue to provide stored power, the overall performance and projected life of the battery cells may be impacted by the charge imbalance.

Battery balancing system 200 may include an exemplary charge balancer 230 coupled to each battery cell 220. Battery cell 220 may be made up of one or more individual battery cells connected in parallel. Overall system feedback error 250 may be used as an input to charge balancer 230. These errors may subsequently be used to drive charge balancer 230 to a desired voltage, with an ultimate goal of driving the error to zero. Charge balancer 230, which is essentially a voltage regulator, operates in current limit mode until the battery cell 220 voltage is equal to the error voltage, and consequently all battery cells 220 are charged to the same voltage.

Referring to FIG. 3A, an alternative charge balancer 310 is presented. Charge balancer 310 is a more advanced forward converter with a resonant fly-back reset circuit usable with at least one embodiment of the present invention. The forward/resonant fly-back cell balancing converter 310 may be used in the lithium-ion cell balancing system 200 with continuous drive for all cells 220. The exemplary charge balancer 310 circuit shown may comprise transformer T1 having primary winding T1A, secondary winding T1B, power MOSFET Q1, resistor R2, share bus resistor network R3-R7, diode D1, capacitors C1-C3 and C6-C7, and share bus fuse F1. The forward/resonant fly-back cell balancing converter may be connected to plus terminal 222 and minus terminal 224 of a battery cell 220, plus terminal 312 and minus terminal 314 of the share bus, cell drive 316, and cell monitor 318. The inputs to the forward/resonant fly-back cell balancing converter may be a cell voltage applied between cell plus terminal 222 and cell minus terminal 224, a first drive voltage applied to cell drive 316, and a share bus voltage applied between share bus plus terminal 312 and share bus minus terminal 314 of the common share bus. Tap 1 of primary winding T1A of transformer T1 may be connected to cell plus terminal 222 (coupled to battery cell 220), tap 2 of primary winding T1A may be connected with cell minus terminal 224 of battery cell 220 via power MOSFET Q1. Cell drive 316 may be coupled into the gate of power MOSFET Q1. Tap 3 of secondary winding T1B of the transformer T1 may be connected to share bus plus terminal 312 via share bus resistor network R3-R7 and the share bus fuse F1, and tap 4 of secondary winding T1B of transformer T1 may be connected to the share bus minus terminal 314. In addition, capacitors C1 and C2 bridge the cell plus terminal 222 and cell minus terminal 224 of cell 220, capacitor C3 bridges the gate (G) of transistor Q1 and cell drive 316, capacitors C6 and C7 bridge the source (S) and drain (D) of transistor Q1, and Resistor R2 and diode D1 bridge the source (S) and gate (G) of transistor Q1.

Charge balancer 310 operates by comparing the relative voltage levels of battery cells 220, and compensating battery cells 220 with a lower charge with energy from the higher voltage battery cells. For example, if each battery cell 220 normally maintains a charge of approximately 4 volts, and there is one battery cell that has a charge lower than 4 volts, current may flow from the 4 volt batteries to the lower voltage batteries until all batteries are at approximately the same voltage level. This would be a simple circuit if the battery cell plus terminals 222 were each coupled to the share bus through a resistor, and the battery cell minus terminals 220 were each coupled to ground. In multicell battery 210, however, the battery cells 220 are connected in series, and therefore, the low sides of the individual cells are not tied to ground. Nonetheless, the same effect may be achieved through transformer coupling. The gate (G) of each transistor Q1 may be driven by a square wave (e.g., approximately 100 KHz) with 50% duty cycle. When each transistor Q1 turns on (when the gate drive is +), the voltage across each transformer T1 secondary T1B is equal to the cell voltage. If the cell voltages are all equal, the secondary voltages are equal, and no compensating current flows through resistors R3-R7. During the off half-cycle, the waveform "flies back," producing a half-cycle of a sine wave that also appears on the share bus. Alternatively, if all of the cell voltages are not equal, secondary T1B voltages still match the cell voltages. Compensating current now flows in the through resistors R3-R7, from the highest to lowest cells. Transformers T1 are bidirectional, allowing balancing to occur. The net result is virtually identical to the simple case described above.

FIG. 3A further discloses multiple potential sources of inductive and capacitive response fluctuation (indicated by drawing reference 320) that may contribute to the resulting resonant frequency of charge regulation circuit 310. In these circuits, at least transformer T1 and capacitors C1, C2, C3, C6 and C7 may be influenced by age, temperature, electronic field damage, etc., which in turn may alter the resonant frequency of the circuit from what was determined at design and/or manufacture. In this representation, the size of the letter "L" or "C" indicating each of the aforementioned components represents their relative contribution to the overall resonant frequency of the circuit. Capacitors C1 and C2, in at least one example, are each 100 µf, while C6 and C7 can each be 0.005 µf. The values of C1 and C2 are not particularly important. Their function is to provide good bypassing by providing a very low impedance at the frequency of operation. C1 and C2 can be tantalum electrolytic capacitors, with very low ESR (effective series resistance), typically 0.1 ohms each. On the other hand, the values of C6 and C7 are very important. These capacitors can be Negative-Positive-Zero (NPO) devices selected for stability and low temperature coefficient. As a result, the contribution of capacitors C6 and C7 may be substantial in determining the resonant frequency. In a system containing multiple charge regulation circuits 310 (e.g., 24 charge balancing circuits for each of 24 cells), the departure from resonant frequency may be exacerbated by the unequal contribution of these components as described above. As a result, a solution is required that can integrate with the above exemplary charge regulation circuits in order to maximize the beneficial effect of said circuit while taking into account the possibility of a changing resonant frequency in the circuit due to external influences.

Figure 3B:
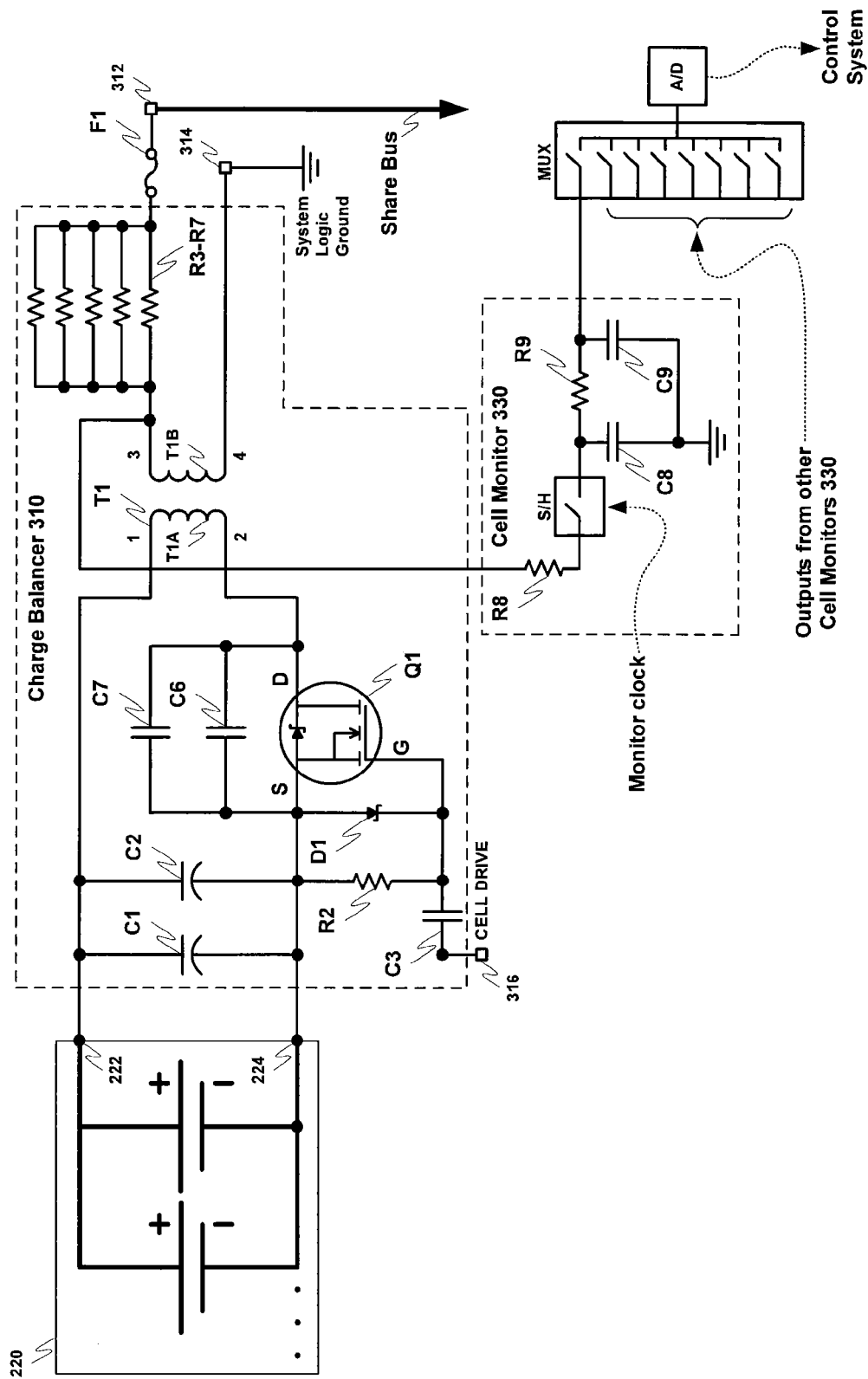
FIG. 3B discloses a battery balancing system including a monitoring circuit usable with at least one embodiment of the present invention.

FIG. 3B includes at least charge balancer 310 as disclosed in FIG. 3A coupled to cell monitoring circuit 330. Cell monitor 330 may be utilized to record the voltage in battery cell 220 for conversion into a digital format readable by a control system (for example, by power control system 150 in FIG. 1). Cell monitor 330 may be composed of a sample and hold circuit (S/H) coupled to the T1B coil of transformer T1 through resistor R8. The S/H circuit includes a field effect transistor, or FET, (not pictured) that may be driven by a monitor clock (described in detail with regard to FIG. 5). When the monitor clock is high, the FET is turned on and the S/H circuit begins sampling. A capacitor is charged to the voltage level of T1, which is equal to the real-time voltage of battery cell 220. The monitor clock may then go low, and the voltage is then held by the S/H circuit. The captured voltage is passed by a low pass filter, composed of resistor R9 and capacitors C8 and C9, to a multiplexer (MUX). The MUX may sequentially sample the captured voltages of all charge balancers 310 through cell monitoring circuits 330. Each analog voltage is fed to an analog to digital converter (A/D), which converts the voltage into a digital value which may be read by a control system, giving the control system an updated measurement of the voltage in each battery cell 220. There may be a cell monitor circuit 330 coupled to each charge balancer 310 within battery system 200, and all cell monitors 330 may be coupled to the MUX, which forwards the voltage reading from each battery cell 220 to the A/D for conversion.

II. Implementation of Resonant Frequency Compensation in Accordance with at Least One Embodiment of the Present Invention.

Figure 4:
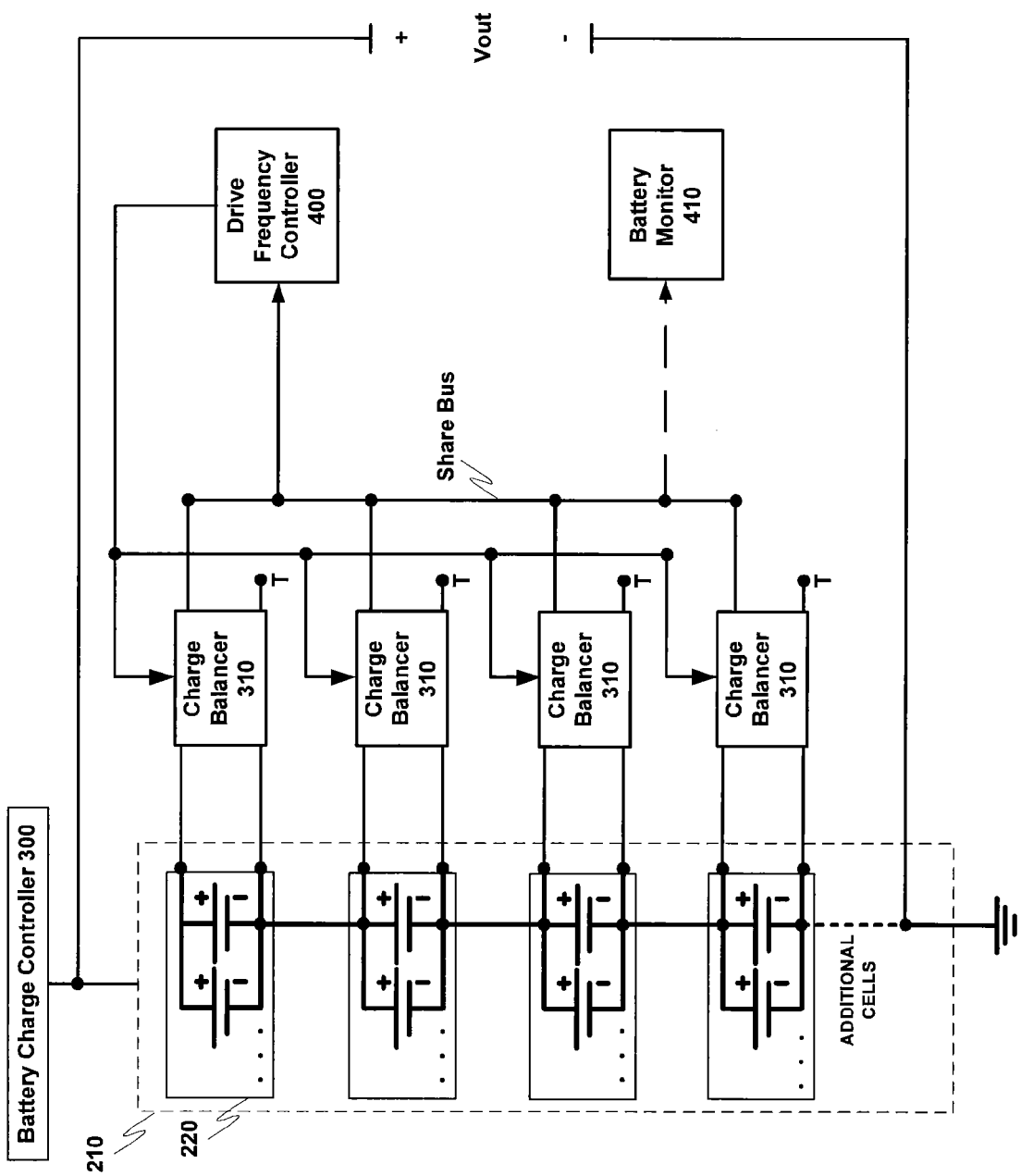
FIG. 4 discloses a diagram of a battery balancing system combined with a drive frequency controller in accordance with at least one embodiment of the present invention.

Referring now to FIG. 4, the present invention may integrate with the exemplary balancing circuits previously disclosed in order to enhance the overall performance of the battery balancing system 200. FIG. 4 discloses an exemplary layout in accordance with at least one embodiment of the present invention. Similar to the previous examples, battery 210 is composed of a plurality of battery cells 220. Battery cells 220 may each be coupled to a charge balancing circuit 310, such as the circuit depicted in detail in FIG. 3. Each charge balancing circuit is further coupled to a share bus, and may in some cases include telemetry outputs (indicated as "T" in FIG. 4) which may be used to relay specific information about the condition of a battery cell to a central controller (e.g., master control system 130, ground control via communication system 140, etc.). These diagnostic telemetry outputs may also be supplemented by additional monitoring equipment 410 that may be implemented to aid in maintaining the battery system.

Drive frequency controller 400 is coupled to at least the share bus and each charge balancer 310. This controller receives an input of overall resonant frequency from the share bus, and uses this input to determine a current drive frequency for charge balancers 310. In this way, the system of the present invention may, in at least one embodiment, account for changes in charge balancer 310 circuit performance due to any or all of the aforementioned environmental influences 120. A current or actual resonant frequency is read from the share bus, and this frequency is used to drive the charge balancers 310. In this way, battery balancing system 200 may function at an optimal level regardless of the environmental influences affecting the battery system 170.

Figure 5:
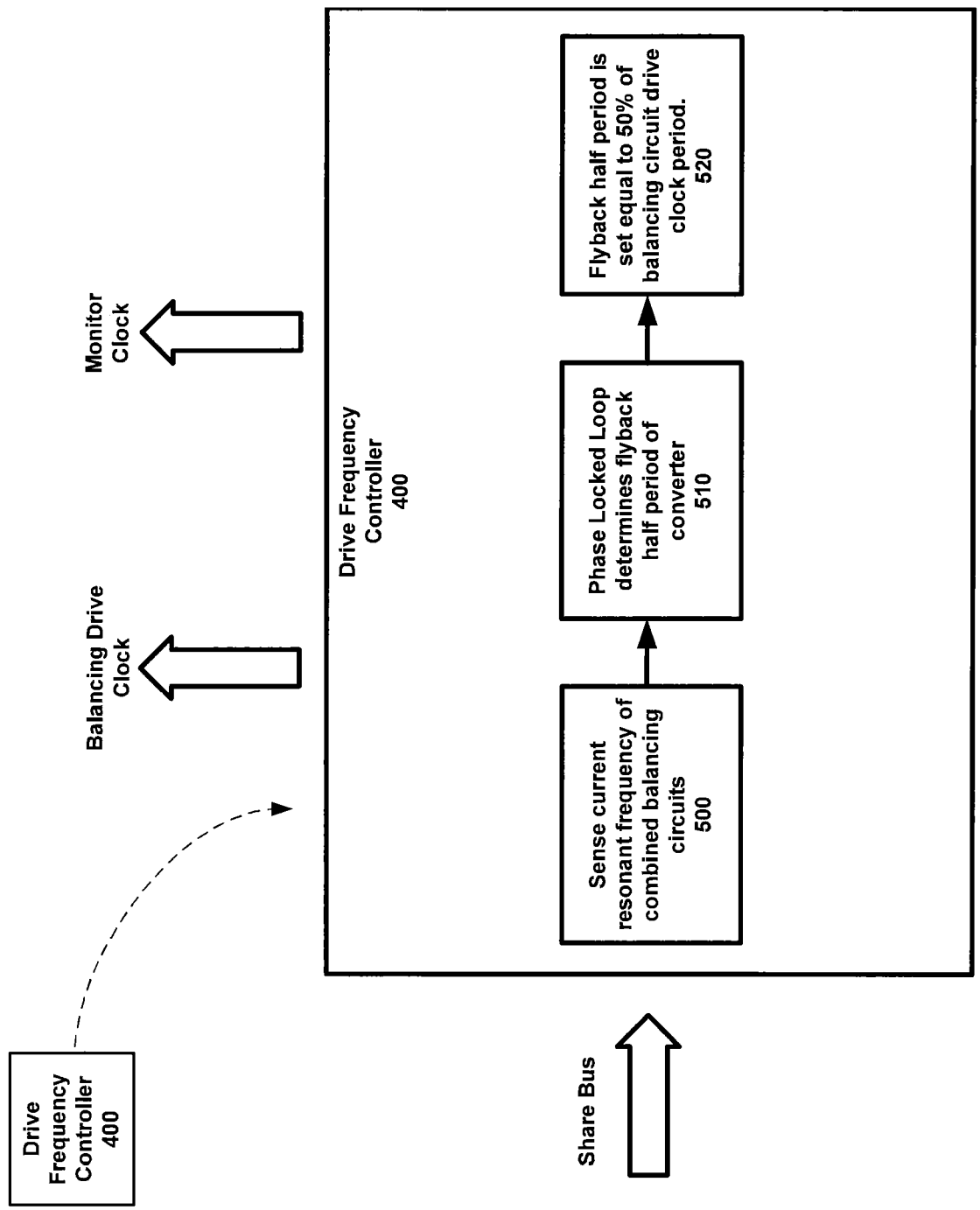
FIG. 5 discloses a functional flow diagram of a frequency drive controller in accordance with at least one embodiment of the present invention.

FIG. 5 discloses a functional representation of drive frequency controller 400. Drive frequency controller 400 may receive a waveform from charge balancers 310 as an input, which in actuality is an output waveform created by the flyback regulators that make up balancing circuits 310. The controller uses this information to output a balancing circuit drive clock back to charge balancers 310, and monitor clock to drive cell monitors 330. More specifically, in an exemplary first step drive frequency controller 400 may sense a real-time combined resonant frequency of all balancing circuits 310 coupled to the share bus in step 500. Additional detail regarding example waveforms seen by, and created in, drive frequency controller 400 is disclosed in FIG. 6A.

Figure 6A:
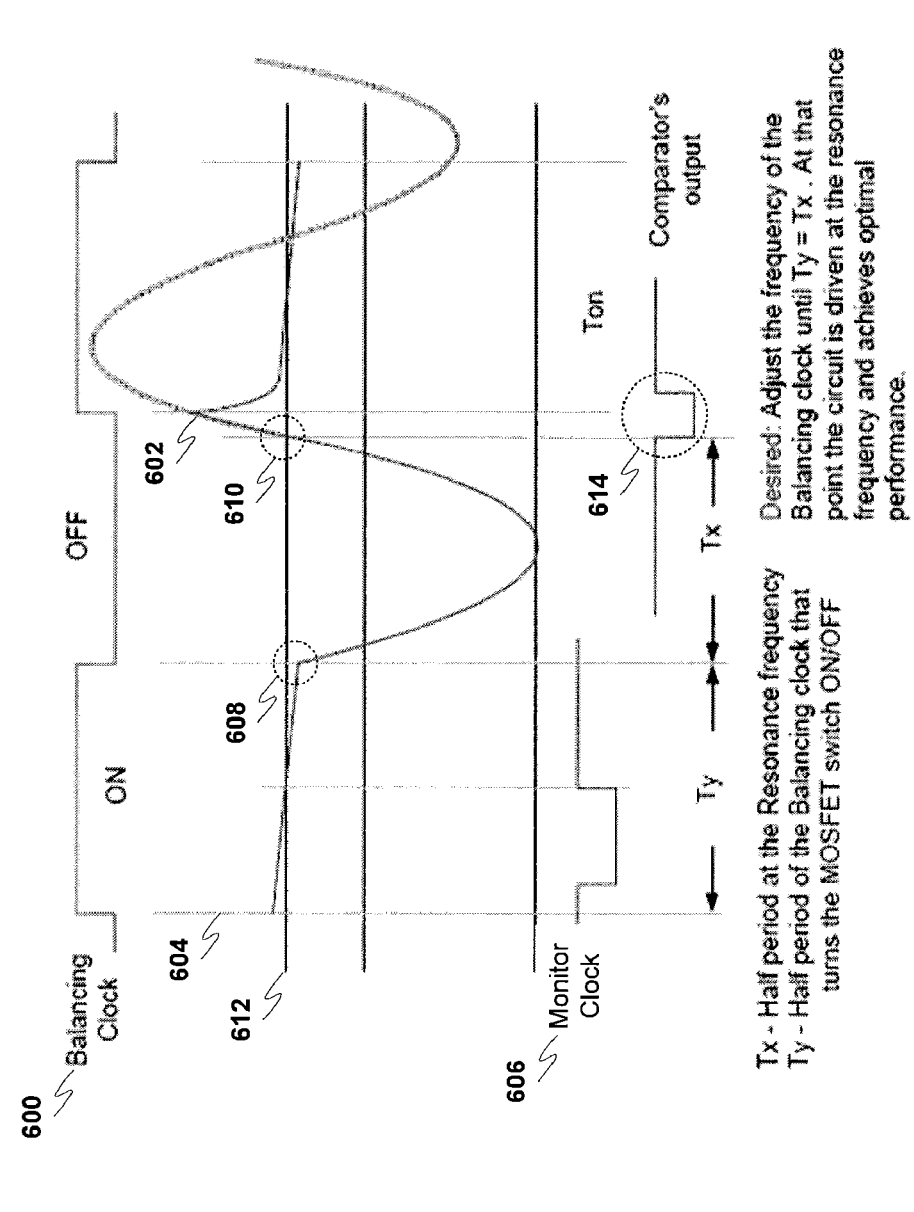
FIG. 6A discloses an exemplary drive clock derivation including waveforms created during system operation in accordance with at least one embodiment of the present invention.

An exemplary output waveform for these circuits may be seen in FIG. 6A. A balancing drive clock, whose output waveform is currently driving the system, is seen at the top of the graph at 600. This is the current driving waveform for the balancing circuits before correction. The waveform created by the output of balancing circuits 310 on the share bus is seen at 602. Here the waveform may be divided into two phases that drive the exemplary forward/resonant fly-back cell balancing converter 310 in FIG. 3. Starting at 604, the transistor (for example Q1 in FIG. 3) is switched on. This is indicated in FIG. 6 by the "ON" label in the waveform of balancing drive clock 600. In this phase the primary coil T1A of transformer T1 charges. At 608 the first half of the period ends and the transistor is turned off. This duration is represented by "Ty" in FIG. 6A.

The transformer is now "OFF" in accordance with the waveform of balancing drive clock 600. The fly-back effect begins at 608, wherein the primary coil discharges, forcing a similar effect in the secondary coil T1B of transformer T1. The fly-back effect completes at 610 where the output 602 of charge balancers 310 again crosses the zero line 612 of the graph. The duration of the fly-back behavior has been indicated as "Tx" in FIG. 6A. There is a noticeable difference between Ty and Tx, demonstrating that the current driving frequency and the resonant frequency of the system are not equal. This difference is also seen in comparator output 614. At least one objective of drive frequency controller 400 is to continually update the drive frequency so that the difference between the balancing drive clock frequency and the resonant frequency approaches zero, or in other words, so that Ty=Tx.

An exemplary waveform for monitor clock 606 is also shown in FIG. 6A. This signal is used to drive the S/D device as previously described with respect to monitoring circuits 330. Monitor clock 606 may have the same frequency as balancing drive clock 600. The leading edge of this waveform may be located approximately the 10% point of the "on time" of balance clock 600, and the trailing edge may be located approximately at the 50% point. In at least one embodiment of the present invention, monitor clock 606 is adjusted similarly to the balance clock 600 to approximate the actual resonant frequency of charge balancers 310.

Referring to FIG. 6B, an alternative example of the derivation of an adjusted balancing drive clock is shown. A high-speed digital comparator (e.g., an Analog Devices AD8561) may compare the share bus voltage to a threshold voltage. The threshold voltage may be a fixed voltage (e.g. −7 VDC), or it may be derived as part of the process. The comparator circuit may be a negative peak detector that has the advantage that the threshold voltage follows the negative peak. The comparator output may be "0" when the share bus voltage is above the threshold voltage, and switches to "1" when the share bus voltage drops below the threshold voltage. An exemplary comparator output is shown in FIG. 6B at 620. In at least one case, the midpoint of comparator output may occur at the time of the negative peak of the fly-back signal. The comparator output signal may then in turn be supplied to a ASIC or other device capable of processing the signal. In an exemplary ASIC, two timers may be used. The first timer (timer 1) measures a duration from the start of the drive clock OFF period until the leading edge of comparator output signal (when the comparator switches to "1") by counting the number of time periods (e.g., 24 MHz clocks cycles). An example of the duration recorded by T1 is shown at 622. The second timer (timer 2) measures a duration from the start of the drive clock OFF time until the comparator switches back to "0" (share bus output voltage rises above threshold voltage), an example of which is further shown in FIG. 6B at 624. The average of the first timer (t1) and the second timer (t2), which is (t1+t2)/2, may be performed digitally in the ASIC, and equals one quarter of the full adjusted drive clock.

Returning to FIG. 5, drive frequency controller 400 may employ a phase locked loop (PLL) architecture in step 510 to equate the fly-back half period time measured from the input waveform to the output balancing circuit drive clock. A PLL principally contains a phase detector a VCO and an amplifier. The phase detector is a device that compares two input frequencies, generating an output that is a measure of their phase difference. If, for example, the two input frequencies are not equal, the phase detector may provide a periodic output at the difference frequency. The phase error signal, after being amplified, causes the VCO frequency to deviate in the direction of the input frequency. If conditions are correct, the VCO frequency will quickly "lock" on to the input frequency, maintaining a matching relationship to the input signal.

III. Mathematical Simulation and Derivation of Requirements for a PLL as Implemented in at Least One Embodiment of the Present Invention.

A mathematical time discrete form of a PLL usable in at least one embodiment of the present invention is shown in FIG. 7. In discrete time systems, the signals are sampled at a constant rate. When the input x(t) is observed every $\tau$ seconds we get the series $x_n = x(t_n)$ wherein $t_n = \tau \cdot n$. Then the output is also a series $y_n = y(t_n)$. In the discrete case, the integral in the equation:

$$y(t) = y(0) + \int_0^t x(\tau) \cdot d\tau \quad (1)$$

is replaced by the difference equation:

$$y_n = y_{n-1} + x_n \text{ and}$$

$$y_0 = y(0) \quad (2)$$

Solving the difference equations on a digital computer or, for example, in an FPGA, is relatively straightforward since it requires simple iterative substitution. On the other hand, solving time continuous equations may be very difficult. It is for this reason that time continuous problems are often transformed to time discrete problems in order to simplify the solutions using a digital computer and/or an FPGA.

In the continuous case a Laplace transform is used to represent the system and in the discrete case we use Z-transform. The difference equation (2) has the Z-transform $$Y(z) = X(z) \cdot \frac{1}{1 - z^{-1}} \quad (3)$$

In FIG. 7 we show system 710 in its discrete form. The closed loop transfer function is:

$$G(z) = \frac{Y(z)}{X(z)} = \frac{K}{1(1-K) \cdot z^{-1}} \quad (4)$$

It is important to observe that while a continuous system is stable for any K, the same is not true for a time discrete system. The choice of K is limited by stability consideration. The stability of a continuous system is determined by the location of the poles of the closed loop transfer function. A system will be stable if all poles of the closed loop transfer function lie strictly in the left hand side of the s-plane. In the simple case of a single pole system, the pole of the closed loop system $$G(s) = \frac{Y_{(s)}}{X_{(s)}} = \frac{1}{1 + \frac{1}{K}s} = \frac{1}{1 + sT}$$

is at $$s = -\frac{1}{T},$$

which is strictly in the left hand side of the s plane for any positive T (or any positive K), and hence, is stable for any K>0.

A time discrete system will be stable if all the poles of its closed loop Z-transform lie inside the unit circle in the z plane. In the simple case of a single pole system, the pole of the closed loop system (see equation (3)) is at z=1−K. As seen at 700 in FIG. 7, the system will be stable for 0<K<2. For implementation in an FPGA it is convenient to convert the Z-transform of equation (4) into a difference equation:

$y(n) = (1-K) \cdot y_{n-1} + K \cdot x_n$ and $$y_0 = y(0) \quad (5)$$

In various embodiments of the present invention, the relationship between K and the response time may be important. To demonstrate this relationship, the first step will be to solve equation (5) for a step response to better understand the parameter K. From stability consideration we have shown that |1−K|<1. If we substitute q=1−K, and assume a step function in the input (i.e. $x_n = x_0$, a constant) equation (5) becomes:

$y(n) = q \cdot y_{n-1} + (1-q) \cdot x_0$ and $$y_0 = y(0) \quad (6)$$

The closed form solution of equation (6) is:

$$y_n = [y(0) - x_0] \cdot q + x_0 \quad (7)$$

If we assume zero initial condition (i.e. y(0)=0), we get a very familiar form:

$$y_n = x_0 \cdot (1-q) \quad (8)$$

Comparing the step response of the continuous system $$y(t) = x_0 \cdot \left(1 - e^{\frac{-t}{T}}\right)$$

with the step response in equation (8) we can see the similarity as both systems converge "exponentially" to the steady state value. However, there is an important difference. In the discrete case, if −1<q<0 the system still converges but with strong oscillations. It is recommended to avoid that region of q (and hence K) and choose 0<q<1 or 0<K<1.

Therefore, a small K (near zero) will have a slow response time while a larger K near 1 will have a faster response time. If N is defined as the number of iterations (i.e. sampling time periods) required for the step response to reach 63.21% of steady state, then K and N are related by the following:

$$K = 1 - e^{-1/N} \quad (9)$$

Figure 8:
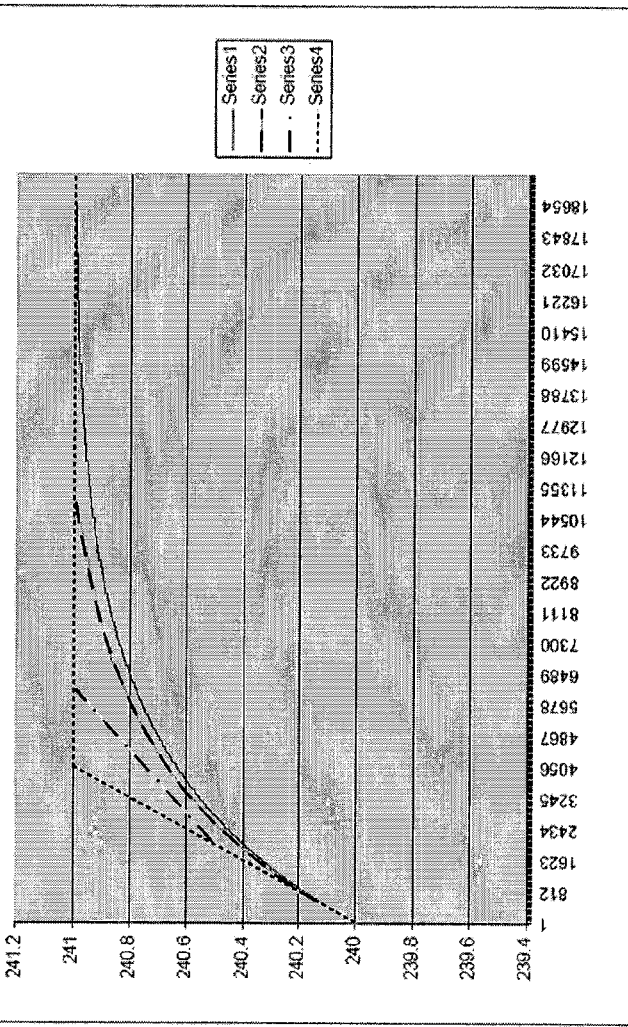
FIG. 8 discloses exemplary tables and graphs of calculated results regarding phase locked loop performance in accordance with at least one embodiment of the present invention.

Table 1 in FIG. 8 discloses some typical values for N and K based on this relationship.

More specifically, the Phase Locked Loop (PLL) for drive frequency controller 400 runs with a sampling rate τ of 10 us. Table 2 disclosed in FIG. 8 includes the values of K for a desired PLL time constant. One substantial behavior is that very small changes in K will have a very significant effect on the PLL time constant. This poses computational constraint that must be evaluated carefully.

The bottom line of all of this math is that we need to implement equation (8) in, for example, an FPGA with numbers (i.e. the variable K) that have a very large range and require many significant digits in the computation. On the other hand, the silicon resource may be limited, which means that the accuracy of the computation must be kept to an acceptable minimum. The first decision is to use K that is a binary fraction, $K = 2^{-M}$. The selection of K can now be presented in terms of M. Table 3 in FIG. 8 discloses exemplary values of M with respect to K.

Equation (5) can be rewritten as:

$$y_n = \frac{(2^M - 1) \cdot y_{n-1} + x_n}{2^M} \quad (10)$$

and for implementation reasons:

$$y_n = y_{n-1} + \frac{x_n - y_{n-1}}{2^M} \quad (11)$$

It is important to note that equation (11) requires no multiplication only addition, subtraction and a division by a binary number that is implemented as a simple shift.

The PLL utilized in drive frequency controller 400 operates at approximately 100 KHz with a processing clock (i.e. system clock) of 24 MHz. This implies that $$y_n \approx \frac{24 \cdot 10^6}{100 \cdot 10^3} = 240.$$

In order to have sufficient dynamic range for the frequency of the balancing oscillator, 9 bits will be used for the integer portion of $y_n$. This implies an output range of $0 < y_n < 511$ or a frequency as low as 47 KHz. The choice of 9 bits imposes no limitation on the high end of the frequency.

If the PLL circuit requires a time constant of 160 ms, it may be seen from FIG. 8, table 3, that M of equation (11) must be 14. This implies that n y must have at least 14 bits to represent the binary fraction otherwise the division in equation (11) will be truncated. Adding up the 9 bits required for the integer portion of $y_n$ and the 14 bits required for the fraction we get 23 bit. This translates immediately to 23 bit arithmetic (registers, add, subtract) in an exemplary case where an FPGA is utilized to create the functionality of drive frequency controller 400.

However, according to the graph labeled "FIG. 4" disclosed in FIG. 8, 9 bits is not sufficient. A simulation was performed utilizing four different solutions to equation (11). In all cases 9 bits for the integral part and M=14 was used. The graph shows the step response of the PLL when the input goes from 240 to 241 (i.e. small perturbation).

Case 1: (series 4) 14 bits was used for the fraction, total word size 23 bits
Case 2: (series 3) 15 bits was used for the fraction, total word size 24 bits
Case 3: (series 2) 17 bits was used for the fraction, total word size 26 bits
Case 4: (series 1) 20 bits was used for the fraction, total word size 29 bits It is evident that when a word size of 23 bits is used the transient is distorted due to numerical truncation in the computation. The transient improves as more bits are added, but it appears that after 29 bits we achieve a sufficiently good response curve. As a result, for a time constant of 160 ms, 29 bit numbers may be used with 9 bits representing the integral part and 20 bits representing the binary fraction.

The aforementioned PLL may be implemented in hardware as a custom microchip solution such as ASIC, FPGA, MCM, or alternatively, may also be run as a software module in a microprocessor integrated within, or at least coupled to, battery balancing system 200. The PLL may be utilized to determine the fly-back frequency time of charge balancer circuits 310. This time is used to determine 50% of the period for the balancing circuit drive clock time (as shown in FIG. 5, step 520). Using this balancing circuit drive clock time, the charge balancer circuits 310 should be constantly driven at the most appropriate clock period in view of the natural resonant frequency of charge balancer circuits 310.

III. Compensation for Parasitic Resistance in a Battery Monitoring System.

As previously described with respect to FIG. 3B, cell monitoring circuits 330 may be utilized to determine a current voltage level for battery cells 200 in accordance with at least one embodiment of the present invention. Each battery cell 220 may have its own monitoring circuit 330, and all of these monitoring circuits may be multiplexed together. As set forth above, in an exemplary battery system 170 at least one microprocessor may monitor and control the voltage of 24 or more individual battery cells 220. Overall, the cell monitoring system of the instant invention may report a measured charge level in any battery cell 220, at any given time, to the at least one microprocessor. In response, the at least one microprocessor may be responsible for a multitude of functions such as generating a balance clock and monitor clock, reporting telemetry information of monitor voltages and battery voltage to another local or remote system (e.g., transmitting the telemetry information to a terrestrial monitoring station), performing automatic internal calibration, supplying power, on/off control, etc. However, the operation of the system may be affected by inaccuracy in battery charge monitoring experienced, for example, due to variations in circuit characteristics caused by the operation of each charge balancer 310. The cause/effect of this inaccuracy is discussed further with regard to FIG. 9A.

Figure 9A:
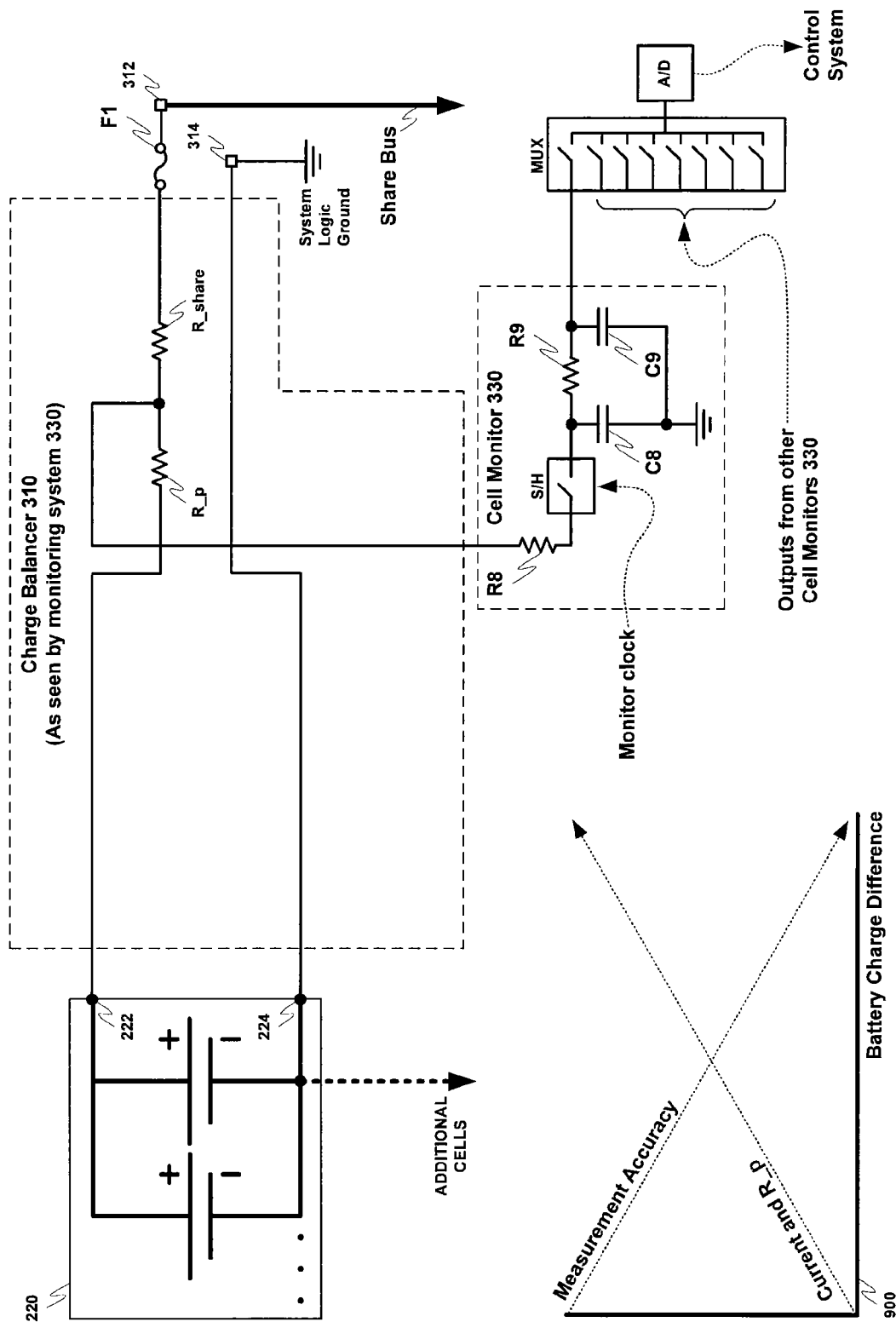
FIG. 9A discloses an exemplary cell monitoring circuit diagram in accordance with at least one embodiment of the present invention.

The charge balancing and monitoring system depicted in FIG. 9A is similar to the system of FIG. 3B except that charge balancer 310 is replaced by a simplified representation of the circuit from the perspective of cell monitor 330. There are at least two substantial resistance values that may influence the accuracy of the charge measured for each cell (V_mon): the share bus resistance value (R_share) and the parasitic resistance value (R_p) that may unavoidably be induced when using "real world" electrical components. In the cell balancing process, the share bus voltage is equal to the average voltage of all of the cells. Each cell may be connected to the share bus through a resistor (e.g., about 1 ohm) which makes up the greatest part of R_share. This resistor may be used to set a "Transfer Ratio" that determines the magnitude of current when the cells are not balanced. High voltage cells put current into the share bus, and low cells receive current from the share bus. Eventually the cell voltages equalize through this process.

In addition to the "intentional" R_share resistance, parasitic (unintentional) resistance R_p may also be present. Contributors to R_p may include circuit wiring, secondary DC resistance (DCR) in balancing transformer T1, on-state resistance, or RDS (on), of the transistor Q1, etc. While the use of very large capacitors, very large FET's and/or bigger-gauge electrical conductors is at least one known solution for reducing parasitic resistance in a circuit, the use of such corrective components may be prohibitive due to cost, space, power conservation requirements, etc., especially when the circuit is being implemented in an extremely remote application like a satellite. For balancing, this parasitic resistance basically increases the 1 ohm summing resistance R_share, which is not usually a problem for the operation of charge balancer 310 in general. The parasitic resistance may cause a change in the transfer ratio, which may change the time required to achieve charge balance, but not the final voltage when balance is achieved. In fact, the summing resistance may, in some cases, be reduced, such that the total resistance (the summing resistor plus the parasitic resistance) equals 1 ohm. However, the parasitic resistance does cause an undesirable error in the measured monitoring voltage. For instance, a monitor voltage error for a particular low cell 220 in a 24 cell battery system 170 may be 287 mV or more, which would be undesirable when trying to render efficient system control.

For each balancing circuit, the monitoring voltage is taken from the secondary winding of the balancing transformer T1. The voltage goes through a Sample/Hold circuit, a low-pass filter, a multiplexer and an A/D Converter as previously discussed with respect to cell monitor 330. The digitized monitoring voltages are then sent to the at least one microprocessor for analysis. If all of the cells 220 are close to balance, the balancing currents will be low (e.g., close to zero), and the monitoring errors will be small. However, if one or more 220 cells are out of balance, the balancing current will be high, and large errors may occur due to an IR drop caused by the parasitic resistance R_p. This relationship is graphically depicted in FIG. 6 at 900. As the difference in charge level between battery cells 220 increases, so does the current and parasitic resistance R_p. As a result, the accuracy of monitored cell voltages may decrease.

In order to obtain more accurate measurements, at least one embodiment of the present invention may include functionality to adjust the raw monitored voltages from each battery cell 220 to account for the error induced by the parasitic resistance. The monitoring error is equal to the IR drop across R_p, which is the voltage difference between V_mon and V_cell:

$$V\_cell_i = V\_mon_i + \left(\frac{R\_p}{R\_share}\right)(V\_mon_i - V\_avg) \quad (12)$$

In an exemplary battery system having a total of "i" of cells: $V\_cell_i$ is the actual cell voltage for each cell from 1 to i, $V\_mon_i$ is the monitored voltage read by cell monitor 330 for each cell from 1 to i, R_p is the parasitic resistance (e.g., typically 0.3 ohm), R_share is the share bus resistance (e.g., typically 1.0 ohm) and V_avg is the share bus voltage. To implement the previously described IR correction, V_avg may be measured from the share bus. V_mon may be measured by each cell monitor 330, which is routed through multiplexer (MUX) to analog/digital converter (A/D). The digital measurement signal may then be used by the at least one microprocessor in implementing control, reporting telemetry, taking corrective actions, etc.

Figure 9B:
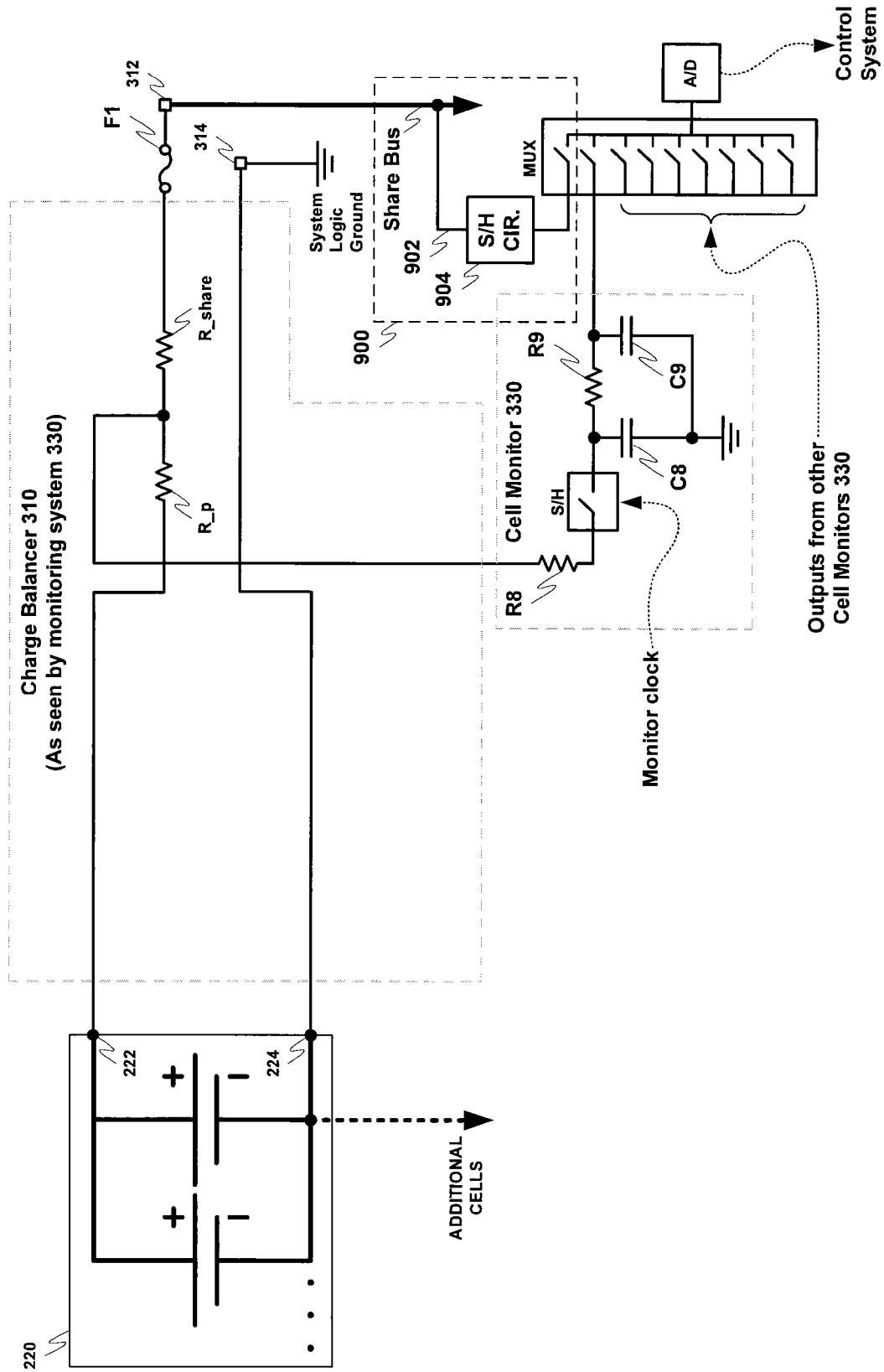
FIG. 9B discloses an alternative exemplary cell monitoring circuit diagram in accordance with at least one embodiment of the present invention.

The share bus voltage may be measured or estimated using various techniques. For example, the total battery voltage may be measured and then divided by the number of cells. Alternatively, the average of the individual cell monitor voltages may be computed, or the share bus voltage may be measured directly. An example of the direct measurement of the share bus voltage is disclosed in FIG. 9B. Circuit 900 shows another sample and hold circuit 904 similar to cell monitor 330 that may couple (e.g., via 902) the share bus to a multiplexer input. In an exemplary 24-cell battery system 170, a 25th multiplexer input may be used for the share bus.

A blown fuse, in some instances, may also be problematic when measuring cell voltages. Fuse F1 may be used to disconnect a particular cell balancing circuit in the case of a failed shorted cell, which may be a potential failure mode of a lithium-ion cell. In this event, several amps will flow into the shorted cell, and fuse F1 will open. (In at least one embodiment of the present invention, the nominal cell voltage may be 4.0 volts, (R1+R2) is 1 ohm, and F1 is a 1 amp fuse.) A fuse F1 opening effectively disconnects a shorted cell from the share bus, and allows balancing to proceed normally among the remaining good cells. For example, a normal 24-cell battery system 170 may provide 96 volts. If a cell shorts, a 23-cell battery providing 92 volts remains. A properly designed system may continue to operate with several cells shorted.

Further, with regard to the previously discussed methods for estimating the share bus voltage, the first two methods rely on the computation of an average voltage, which would in turn require knowledge of the number (N) of participating cell balancing circuits. In an example situation where one fuse F1 becomes open in a 24-cell battery system 170, N (e.g. the number of active battery cells 200) is reduced from 24 to 23. Therefore, to correctly utilize either of these two methods, the at least one microprocessor must have knowledge of the number of active (or open) fuses. Information related to the number of active cells and/or open fuses may be sent to the at least one microprocessor via monitoring resources in any of the aforementioned circuits.

Figure 10:
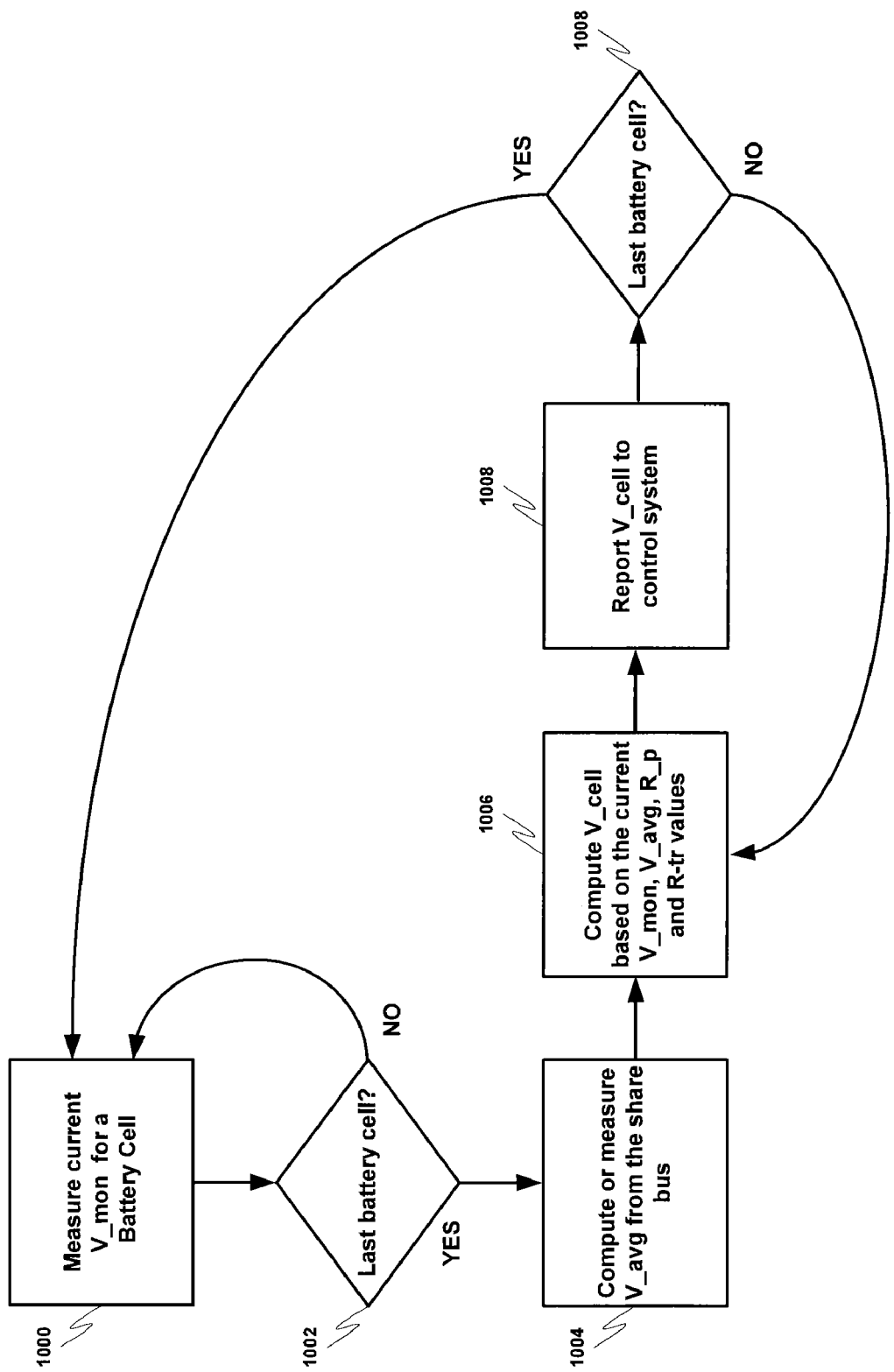
FIG. 10 discloses an exemplary flow chart describing a process in accordance with at least one embodiment of the present invention.

The calculation in equation (12) may be performed on each measured voltage in a processing device (e.g., ASIC, FGPA, Controller, etc.) FIG. 10 discloses a flow chart describing the correction process in accordance with at least one embodiment of the present invention. In step 1000 cell monitor 330 measures V_mon from a battery cell. In the present example, V_mon may be measured and stored for each cell until all the cells are measured (step 1002). Alternatively, each V_cell may be completely calculated before the next raw V_mon value is measured. V_avg is measured or calculated in step 1004 (e.g., in accordance with the exemplary methods for obtaining share bus voltage set forth above), and V_cell is then calculated for each battery cell 220 based on each V_mon, V_avg, R_p and R_share in step 1006. R_p and R_share may be estimated for each circuit based on the 1 ohm share bus resistor and the empirical testing of circuit behavior, these values may also be measured in real time. In step 1008, each V_cell may be reported to a control system such as power control system 150. After all the V_cell values have been calculated and reported, the process may again be initiated at step 1008.

The present invention improves upon the state of the art by adding functionality to a power system that was previously not anticipated. The present invention may improve current battery balancing systems by allowing essential resources to continuously function at optimum efficiency regardless of the impact of "real world" influences on various components within the system. The present system provides this functionality by at least monitoring cell voltage levels and adjusting these monitored voltage levels to an actual value for use by at least one processor, which it may utilize these actual voltage levels for control, optimization, telemetry reporting, etc.

Accordingly, it will be apparent to persons skilled in the relevant art that various changes in forma and detail can be made therein without departing from the spirit and scope of the invention. The breadth and scope of the present invention should not be limited by any of the above-described exemplary embodiments, but should be defined only in accordance with the following claims and their equivalents.

The invention claimed is:

1. A device for correcting a monitored battery cell voltage read from a battery balancing circuit to an actual battery cell voltage, comprising:
    a plurality of balancing circuits, coupled to each of a plurality of coupled battery cells, the plurality of balancing circuits enabled to conduct current to and from the battery cells;
    a share bus, coupled to at least each of the plurality of balancing circuits; and
    a monitoring circuit, coupled to the battery balancing circuit, the monitoring circuit configured to:
        monitor a battery cell voltage;
        monitor a share bus voltage; and
        adjust the monitored battery cell voltage to reflect an actual battery cell voltage based on the share bus voltage, a share bus resistance and a balancing circuit parasitic resistance.

2. The device of claim 1, wherein the plurality of coupled battery cells are serially connected battery banks, each battery bank being made up of one or more battery cells connected in parallel.

3. The device of claim 1, wherein the balancing circuits conduct current from overcharged cells to undercharged cells.

4. The device of claim 1, wherein the monitoring circuits are coupled to a multiplexer.

5. The device of claim 4, wherein the multiplexer is coupled to an analog to digital (A/D) converter which converts the monitored battery cell voltage into a digital value.

6. The device of claim 1, wherein the adjusting of the monitored battery cell voltage is performed by a processing device.

7. The device of claim 1, wherein the adjusting of the monitored battery cell voltage for a total of i cells is governed by the equation:

$$V\_cell_i = V\_mon_i + \left(\frac{R\_p}{R\_share}\right)(V\_mon_i - V\_avg)$$

Wherein $V\_cell_i$ is the actual cell voltage for each cell from 1 to i, $V\_mon_i$ is monitored cell voltage for each cell from 1 to i, R is the parasitic resistance, R_share is the share bus resistance and V_avg is the share bus voltage.

8. The device of claim 7, wherein the share bus voltage is monitored by at least one of computing an average cell voltage or measuring the actual voltage level of the share bus.

9. A method for correcting a monitored battery cell voltage read from a battery balancing circuit to an actual battery cell voltage, comprising:
    monitoring a battery cell voltage from a plurality of balancing circuits each coupled to at least a monitoring circuit, a share bus and a battery cell;
    monitoring the share bus voltage; and
    adjusting the monitored battery cell voltage to reflect an actual battery cell voltage based on the share bus voltage, a share bus resistance and a balancing circuit parasitic resistance.

10. The method of claim 9, wherein the balancing circuits conduct current from overcharged cells to undercharged cells.

11. The method of claim 9, wherein the adjusting of the monitored battery cell voltage is performed by a processing device.

12. The method of claim 9, wherein the adjusting of the monitored battery cell voltage for a total of i cells is governed by the equation:

$$V\_cell_i = V\_mon_i + \left(\frac{R\_p}{R\_share}\right)(V\_mon_i - V\_avg)$$

Wherein $V\_cell_i$ is the actual cell voltage for each cell from 1 to i, $V\_mon_i$ is monitored cell voltage for each cell from 1 to i, $R\_p$ is the parasitic resistance, $R\_share$ is the share bus resistance and $V\_avg$ is the share bus voltage.

13. The method of claim 12, wherein the share bus voltage is monitored by at least one of computing an average cell voltage or measuring the actual voltage level of the share bus.

14. A system for balancing the energy level of a plurality of coupled battery cells, comprising:
 a battery balancing system including a plurality of balancing circuits;
 the plurality of balancing circuits, coupled to each of a plurality of coupled battery cells, the plurality of balancing circuits enabled to conduct current to and from the battery cells;
 a share bus, coupled to at least each of the plurality of balancing circuits; and
 a monitoring circuit, coupled to the battery balancing circuit, the monitoring circuit configured to:
  monitor a battery cell voltage;
  monitor a share bus voltage; and
  adjust the monitored battery cell voltage to reflect an actual battery cell voltage based on the share bus voltage, a share bus resistance and a balancing circuit parasitic resistance.

15. The system of claim 14, wherein the plurality of coupled battery cells are serially connected battery banks, each battery bank being made up of one or more battery cells connected in parallel.

16. The system of claim 14, wherein the balancing circuits conduct current from overcharged cells to undercharged cells.

17. The system of claim 14, wherein the monitoring circuits are coupled to a multiplexer.

18. The system of claim 17, wherein the multiplexer is coupled to an analog to digital (A/D) converter which converts the monitored battery cell voltage into a digital value.

19. The system of claim 14, wherein the adjusting of the monitored battery cell voltage is performed by a processing device.

20. The system of claim 14, wherein the adjusting of the monitored battery cell voltage for a total of i cells is governed by the equation:

$$V\_cell_i = V\_mon_i + \left(\frac{R\_p}{R\_share}\right)(V\_mon_i - V\_avg)$$

Wherein $V\_cell_i$ is the actual cell voltage for each cell from 1 to i, $V\_mon_i$ is monitored cell voltage for each cell from 1 to i, $R\_p$ is the parasitic resistance, $R\_share$ is the share bus resistance and $V\_avg$ is the share bus voltage.

21. The system of claim 20, wherein the share bus voltage is monitored by at least one of computing an average cell voltage or measuring the actual voltage level of the share bus.

22. A computer program product embodied on a computer-readable medium and configured to cause a processing device to execute method steps, comprising:
 monitoring a battery cell voltage from a plurality of balancing circuits each coupled to at least a monitoring circuit, a share bus and a battery cell;
 monitoring the share bus voltage; and
 adjusting the monitored battery cell voltage to reflect an actual battery cell voltage based on the share bus voltage, a share bus resistance and a balancing circuit parasitic resistance.

23. The computer program product of claim 22, wherein the adjusting of the monitored battery cell voltage for a total of i cells is governed by the equation:

$$V\_cell_i = V\_mon_i + \left(\frac{R\_p}{R\_share}\right)(V\_mon_i - V\_avg)$$

Wherein $V\_cell_i$ is the actual cell voltage for each cell from 1 to i, $V\_mon_i$ is monitored cell voltage for each cell from 1 to i, $R\_p$ is the parasitic resistance, $R\_share$ is the share bus resistance and $V\_avg$ is the share bus voltage.

24. The computer program product of claim 23, wherein the share bus voltage is monitored by at least one of computing an average cell voltage or measuring the actual voltage level of the share bus.

* * * * *